(12) United States Patent
  Oh

(10) Patent No.: US 12,277,996 B2
(45) Date of Patent: Apr. 15, 2025

(54) APPARATUS AND METHOD FOR HARDWARE METERING USING MEMORY-TYPE CAMOUFLAGED CELL

(71) Applicant: ELECTRONICS AND TELECOMMUNICATIONS RESEARCH INSTITUTE, Daejeon (KR)

(72) Inventor: Jae-Mun Oh, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 18/432,390

(22) Filed: Feb. 5, 2024

(65) Prior Publication Data

US 2024/0177753 A1     May 30, 2024

Related U.S. Application Data

(63) Continuation of application No. 17/501,910, filed on Oct. 14, 2021, now Pat. No. 11,929,142.

(30) Foreign Application Priority Data

Jul. 9, 2021   (KR) ........................ 10-2021-0090527

(51) Int. Cl.
  *G11C 7/24*   (2006.01)
(52) U.S. Cl.
  CPC ...................... *G11C 7/24* (2013.01)
(58) Field of Classification Search
  CPC ...................................................... G11C 7/24
  See application file for complete search history.

(56) References Cited

U.S. PATENT DOCUMENTS 9,543,295 B2   1/2017   Yamamoto et al.
11,100,011 B2   8/2021   Ben-Simon et al.
(Continued)

FOREIGN PATENT DOCUMENTS

JP   2016-111446 A   6/2016
JP   2020-095723 A   6/2020
(Continued)

OTHER PUBLICATIONS

Farinaz Koushanfar et al., "Hardware metering," DAC(Design Automation Conference), 2001.
(Continued)

*Primary Examiner* — Douglas King
(74) *Attorney, Agent, or Firm* — LRK PATENT LAW FIRM

(57) ABSTRACT

Disclosed herein is an apparatus for hardware metering using a memory-type camouflaged cell. The apparatus includes memory including at least one camouflaged memory cell in which a key is hidden by a designer in advance and a controller for controlling whether to block the supply of power to the memory. The controller may perform reading a key from a corresponding key location in the multiple memory cells of the memory based on key location information stored in the controller when a key is input from the outside, determining whether the key input from the outside is the same as the key read from the memory, setting an authentic flag based on the determination result, and performing control based on the set authentic flag such that the memory operates normally or the supply of power is blocked.

11 Claims, 10 Drawing Sheets

(56) References Cited

U.S. PATENT DOCUMENTS

| | | |
|---|---|---|
| 2009/0085737 A1 | 4/2009 | Estevez et al. |
| 2014/0351886 A1* | 11/2014 | Edge .................. H04W 12/069 |
| | | 726/3 |
| 2015/0248568 A1* | 9/2015 | Offenberg ........... G06F 21/6218 |
| | | 713/193 |
| 2018/0275900 A1 | 9/2018 | Teranishi et al. |
| 2023/0161715 A1 | 5/2023 | Lee et al. |

FOREIGN PATENT DOCUMENTS

| | | |
|---|---|---|
| KR | 10-2015-0114363 A | 10/2015 |
| KR | 10-2016-0028959 A | 3/2016 |

OTHER PUBLICATIONS

Yousra M. Alkabani et al., "Active Hardware Metering for Intellectual Property Protection and Security," 16th USENIX Security Symposium, 2007.

Farinaz Koushanfar, "Hardware Metering: A Survey," Introduction to Hardware Security and Trust, 2011.

Ujjwal Guin et al., "Counterfeit Integrated Circuits: A Rising Threat in the Global Semiconductor Supply Chain," Proceedings of the IEEE, 2014.

\* cited by examiner $V_{DD} = Q = Qb$ $'0' < V_{DD} = Q = Qb < '1'$

APPARATUS AND METHOD FOR HARDWARE METERING USING MEMORY-TYPE CAMOUFLAGED CELL

CROSS REFERENCE TO RELATED APPLICATION(S)

This application is a continuation of U.S. patent application Ser. No. 17/501,910, filed Oct. 14, 2021, which claims the benefit of Korean Patent Application No. 10-2021-0090527, filed Jul. 9, 2021, which is hereby incorporated by reference in its entirety into this application.

BACKGROUND OF THE INVENTION

1. Technical Field

The disclosed embodiment relates to technology for applying hardware metering in a semiconductor circuit design field.

2. Description of Related Art

In the semiconductor industry, which is becoming increasingly specialized and divided, companies specializing in semiconductor design, namely, fabless companies, have the rights to distribute and sell chips, but have no ability to control the number of semiconductors being produced.

Before compartmentalization of the semiconductor industry, Integrated Device Manufacturers (IDM) themselves performed processes of semiconductor design, wafer fabrication, packaging, and testing, and sold and distributed semiconductors manufactured through these processes.

However, the industrial structure of the semiconductor industry has changed and taken on a form in which fabless companies without manufacturing facilities perform only semiconductor design and outsource the fabrication of semiconductors designed thereby to fabrication plants.

In this case, there is the possibility that a number of chips greater than the number ordered by a fabless company can be manufactured, distributed, and sold. That is, specialization and division of semiconductor-related work cause a problem in which a fabless company, which holds sales and distribution rights for the manufactured semiconductors, has no control over the number of semiconductors to be manufactured.

In order to solve this problem, hardware metering technology has been proposed such that companies specializing in semiconductor design are able to control the number of manufactured semiconductors designed thereby in the specialized semiconductor industry structure.

Hardware metering was first proposed in a paper written by F. Koushanfar and G. Qu and titled "Hardware metering", which was published in the proceedings of the Design Automation Conference (DAC) in 2001. Subsequent thereto, active hardware metering having an improved form was proposed by Y. M. Alkabani and F. Koushanfar in "Active Hardware Metering for Intellectual Property Protection and Security" in 2007. Since then, content related to hardware metering has been published in "Hardware Metering: A survey" and "Counterfeit Integrated Circuits: A Rising Threat in the Global Semiconductor Supply Chain".

SUMMARY OF THE INVENTION

An object of the disclosed embodiment is to provide hardware metering technology in order to give a company specializing in semiconductor design, which outsources the fabrication of semiconductors, the ability to perform control to adjust the number of semiconductors to be manufactured.

Another object of the disclosed embodiment is to provide simpler and more intuitive hardware metering technology using a memory-type camouflaged cell.

Memory according to an embodiment includes multiple memory cells and at least one camouflaged memory cell in which a key value is hidden by a designer in advance, among the multiple memory cells. The camouflaged memory cell may be configured such that the output signal thereof is adjusted based on two or more transistors having different threshold voltages.

Here, the camouflaged memory cell may include a first P-channel transistor, a second P-channel transistor, a first N-channel transistor, and a second N-channel transistor, and respective threshold voltages of the first P-channel transistor and the second P-channel transistor may be different from each other, or respective threshold voltages of the first N-channel transistor and the second N-channel transistor may be different from each other.

Here, the camouflaged memory cell may be configured such that power is applied to respective sources of the first P-channel transistor and the second P-channel transistor, respective drains of the first P-channel transistor and the first N-channel transistor, which are electrically connected to each other, form an output terminal (Q), respective drains of the second P-channel transistor and the second N-channel transistor, which are electrically connected to each other, form an inverted output terminal (Qb), respective sources of the first N-channel transistor and the second N-channel transistor are grounded, the inverted output terminal (Qb) is electrically connected to respective gates of the first P-channel transistor and the first N-channel transistor, and the output terminal (Q) is electrically connected to respective gates of the second P-channel transistor and the second N-channel transistor.

An apparatus for hardware metering using a memory-type camouflaged cell according to an embodiment includes memory including at least one camouflaged memory cell in which a key is hidden by a designer in advance; and a controller for controlling whether to block supply of power to the memory. The controller may perform reading the key from a key location in multiple memory cells of the memory based on key location information stored in the controller when a key is input from an outside; determining whether the key input from the outside is identical to the key read from the memory; setting an authentic flag based on a determination result; and performing control based on the set authentic flag such that the memory operates normally or such that the supply of power is blocked.

Here, the camouflaged memory cell may be configured such that the output signal thereof is adjusted based on two or more transistors having different threshold voltages.

Here, setting the authentic flag may be configured to set the authentic flag to '1' when the key input from the outside is identical to the key read from the memory, and to set the authentic flag to '0' when the key input from the outside is not identical to the key read from the memory.

Here, the controller may further perform outputting the set authentic flag to the outside, and performing the control may be configured to perform the control such that the memory operates normally through fusing of the memory in response to a request from the outside when the authentic signal is '1'.

Here, performing the control may be configured to perform the control such that the supply of power to the memory is blocked when the authentic flag is '0'.

An apparatus for hardware metering using a memory-type camouflaged cell according to an embodiment includes memory including at least one camouflaged memory cell in which a key is hidden by a designer in advance; and a controller for controlling whether to block supply of power to the memory. The controller may perform reading the key from a key location in multiple memory cells of the memory based on key location information when a key and the key location information are input from an outside; determining whether the key input from the outside is identical to the key read from the memory; setting an authentic flag based on a determination result; and performing control based on the set authentic flag such that the memory operates normally or such that the supply of power is blocked.

Here, the camouflaged memory cell may be configured such that the output signal thereof is adjusted based on two or more transistors having different threshold voltages.

Here, setting the authentic flag may be configured to set the authentic flag to '1' when the key input from the outside is identical to the key read from the memory, and to set the authentic flag to '0' when the key input from the outside is not identical to the key read from the memory.

Here, the controller may further perform outputting the set authentic flag to the outside, and performing the control may be configured to perform the control such that the memory operates normally through fusing of the memory in response to a request from the outside when the authentic flag is '1'.

Here, performing the control may be configured to perform the control such that the supply of power to the memory is blocked when the authentic flag is '0'.

An apparatus for hardware metering using a memory-type camouflaged cell according to an embodiment includes memory including at least one camouflaged memory cell in which a key is hidden by a designer in advance and a memory cell in which a message is stored in advance; and a controller for controlling whether to block supply of power to the memory. The controller may perform reading the message from the memory based on a message location stored in the controller in advance and outputting the message when a key location is input from an outside; performing a Hash Message Authentication Code (HMAC) operation based on the message and on the key that is read from the memory based on the key location input from the outside; in response to an outer HMAC input from the outside, determining whether the outer HMAC is identical to an inner HMAC; setting an authentic flag based on a determination result; and performing control based on the set authentic flag such that the memory operates normally or such that the supply of power is blocked.

Here, the camouflaged memory cell may be configured such that the output signal thereof is adjusted based on two or more transistors having different threshold voltages.

Here, the outer HMAC may be acquired by performing the HAMC operation using a key and the message that is output to the outside.

Here, setting the authentic flag may be configured to set the authentic flag to '1' when the outer HMAC is identical to the inner HMAC, and to set the authentic flag to '0' when the outer HMAC is not identical to the inner HMAC.

Here, the controller may further perform outputting the set authentic flag to the outside, and performing the control may be configured to perform the control such that the memory operates normally through fusing of the memory in response to a request from the outside when the authentic flag is '1'.

Here, performing the control may be configured to perform the control such that the supply of power to the memory is blocked when the authentic flag is '0'.

BRIEF DESCRIPTION OF THE DRAWINGS

The above and other objects, features, and advantages of the present invention will be more clearly understood from the following detailed description taken in conjunction with the accompanying drawings, in which.

DESCRIPTION OF THE PREFERRED EMBODIMENTS

Figure 1:
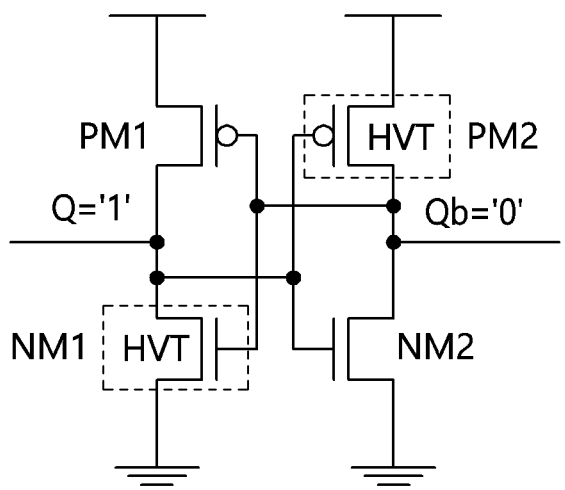
FIG. 1 is an exemplary view of the structure of a camouflaged memory cell according to an embodiment.

The advantages and features of the present invention and methods of achieving the same will be apparent from the exemplary embodiments to be described below in more detail with reference to the accompanying drawings. However, it should be noted that the present invention is not limited to the following exemplary embodiments, and may be implemented in various forms. Accordingly, the exemplary embodiments are provided only to disclose the present invention and to let those skilled in the art know the category of the present invention, and the present invention is to be defined based only on the claims. The same reference numerals or the same reference designators denote the same elements throughout the specification.

It will be understood that, although the terms "first," "second," etc. may be used herein to describe various elements, these elements are not intended to be limited by these terms. These terms are only used to distinguish one element from another element. For example, a first element discussed below could be referred to as a second element without departing from the technical spirit of the present invention.

The terms used herein are for the purpose of describing particular embodiments only, and are not intended to limit the present invention. As used herein, the singular forms are intended to include the plural forms as well, unless the context clearly indicates otherwise. It will be further understood that the terms "comprises," "comprising,", "includes" and/or "including," when used herein, specify the presence of stated features, integers, steps, operations, elements, and/or components, but do not preclude the presence or addition of one or more other features, integers, steps, operations, elements, components, and/or groups thereof.

Unless differently defined, all terms used herein, including technical or scientific terms, have the same meanings as terms generally understood by those skilled in the art to which the present invention pertains. Terms identical to those defined in generally used dictionaries should be interpreted as having meanings identical to contextual meanings of the related art, and are not to be interpreted as having ideal or excessively formal meanings unless they are definitively defined in the present specification.

Hereinafter, an apparatus for hardware metering using a memory-type camouflaged cell according to an embodiment will be described in detail.

The present invention provides hardware metering technology through which the ability to control the number of semiconductors is provided to a company specializing in semiconductor design, which outsources the fabrication of semiconductors, by recording information recognizable only by a designer in a camouflaged memory cell in memory.

That is, a designer may hide a key in memory in the design phase, and may design a chip such that a power supply is locked unless the key of the chip is checked in a test process performed after the chip is manufactured. That is, after a chip is manufactured, a power supply is unlocked only when the key of the chip is checked, after which the chip is capable of operating normally.

Here, a camouflaged memory cell may be configured such that the output signal thereof is adjusted based on two or more transistors having different threshold voltages.

First, a camouflaged memory cell will be described with reference to FIGS. 1 to 8.

FIG. 1 is an exemplary view of a camouflaged memory cell structure according to an embodiment. However, FIG. 1 illustrates an embodiment of the present invention, and the present invention is not limited thereto. That is, a camouflaged memory cell may have a different circuit configuration for generating memory data by diversely combining multiple transistors having different threshold voltages.

Referring to FIG. 1, a camouflaged memory cell may be configured as a latch circuit including a first P-channel transistor (P-MOSFET) PM1, a second P-channel transistor (P-MOSFET) PM2, a first N-channel transistor (N-MOSFET) NM1, and a second N-channel transistor (N-MOSFET) NM2.

That is, according to an embodiment, power may be applied to the source of the first P-channel transistor PM1 and the source of the second P-channel transistor PM2.

The drain of the first P-channel transistor PM1 and the drain of the first N-channel transistor NM1 are electrically connected to each other, thereby forming the output terminal Q. Also, the drain of the second P-channel transistor PM2 and the drain of the second N-channel transistor NM2 are electrically connected to each other, thereby forming the inverted output terminal Qb.

The source of the first N-channel transistor NM1 and the source of the second N-channel transistor NM2 may be grounded.

The inverted output terminal Qb may be electrically connected to respective gates of the first P-channel transistor PM1 and the first N-channel transistor NM1, and the output terminal Q may be electrically connected to respective gates of the second P-channel transistor PM2 and the second N-channel transistor NM2.

Here, the first P-channel transistor PM1 and the second P-channel transistor PM2 may be turned on (the channels thereof may be changed to an ON state) by different threshold voltages.

Alternatively, the first N-channel transistor NM1 and the second N-channel transistor NM2 may be turned on (the channels thereof may be changed to an ON state) by different threshold voltages.

Here, the threshold voltage may be one of a Normal Threshold Voltage (NVT), a Low Threshold Voltage (LVT) lower than the NVT, and a High Threshold Voltage (HVT) higher than the NVT.

Figure 2:
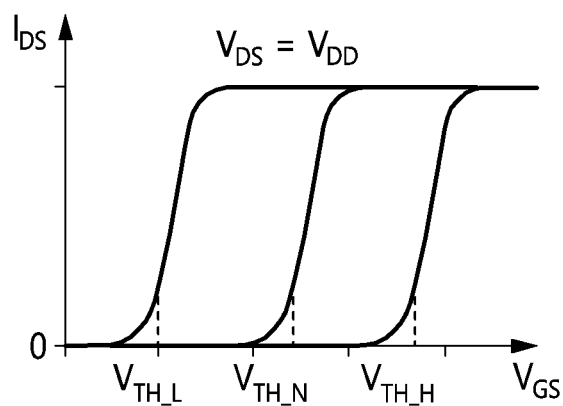
FIG. 2 is a graph illustrating a change in the current of a transistor depending on a threshold voltage.

FIG. 2 is a graph illustrating a change in the current of a transistor depending on a threshold voltage.

Referring to FIG. 2, because the current Ips flowing in a transistor increases in reverse proportion to the magnitude of the threshold voltage, the amount of current flowing in the transistor may be adjusted depending on the threshold voltage.

Accordingly, when transistors having different threshold voltages are arranged differently, the values of the output terminal Q and the inverted output terminal Qb of a latch may be respectively set to '1', which is a high level (HL), and '0', which is a low level (LL), or may be respectively set to '0', which is a low level (LL), and '1', which is a high level (HL).

Figure 3:
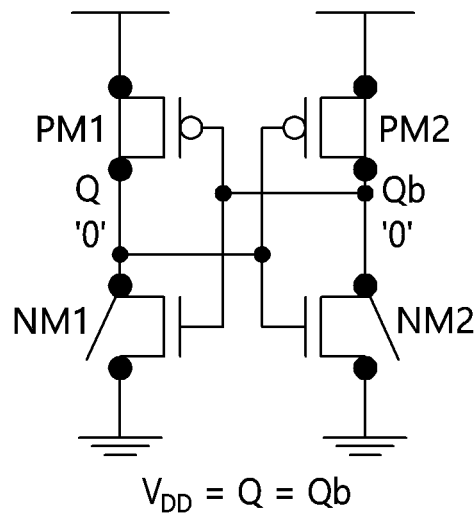
FIG. 3 is an exemplary view of the initial state of a memory cell according to an embodiment.
Figure 4:
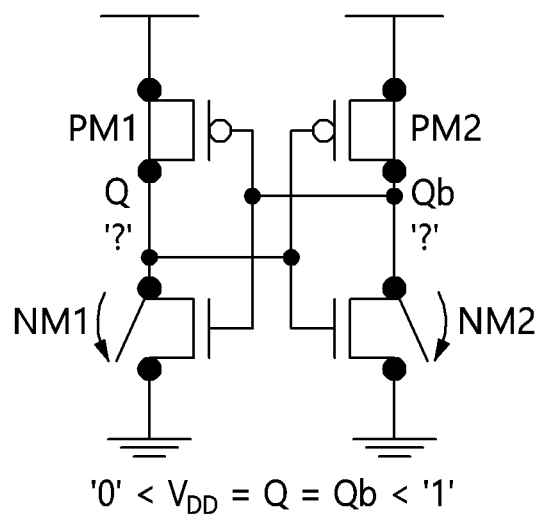
FIG. 4 is an exemplary view of the transient state of a memory cell according to an embodiment.
Figure 5:
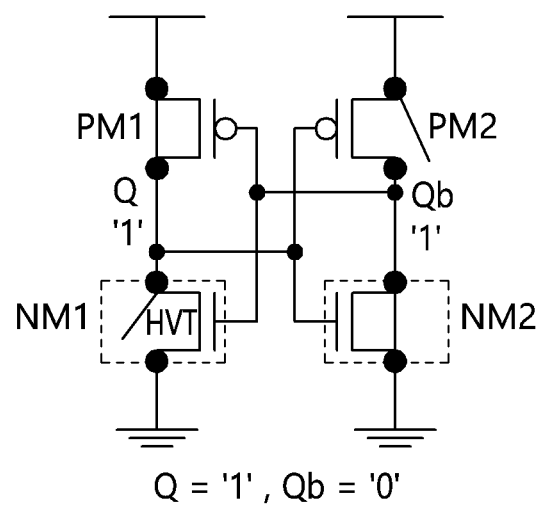
FIGS. 5 and 6 are exemplary views of the final state of a memory cell according to an embodiment.
Figure 6:
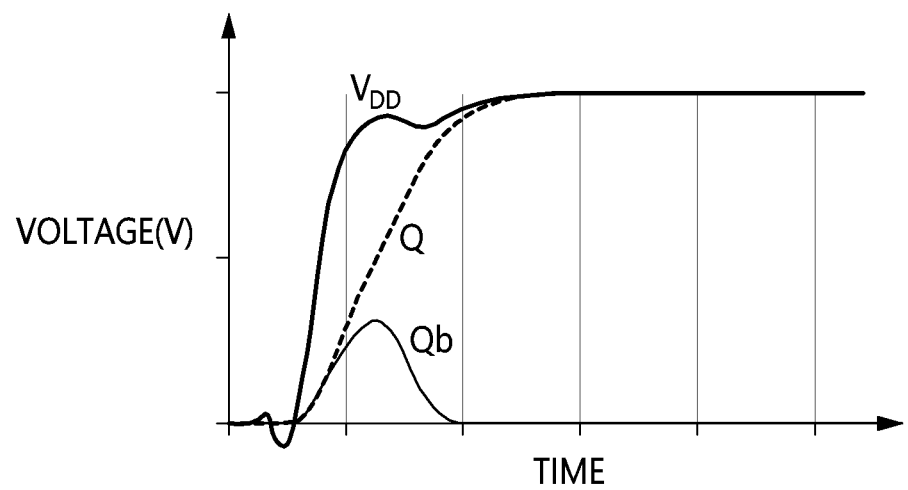
Figure 7:
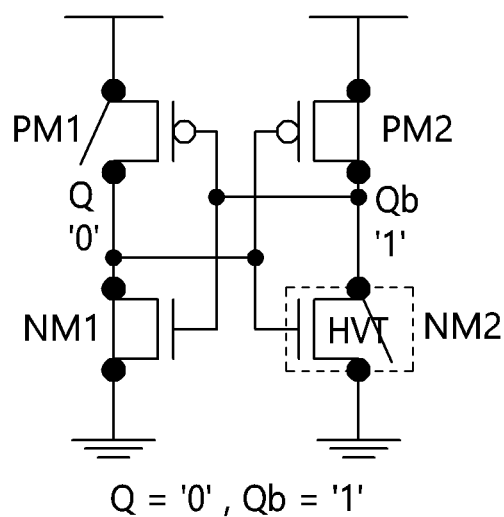
FIGS. 7 and 8 are graphs illustrating changes in voltages at an output terminal and an inverted output terminal over time after a voltage is applied according to an embodiment.
Figure 8:
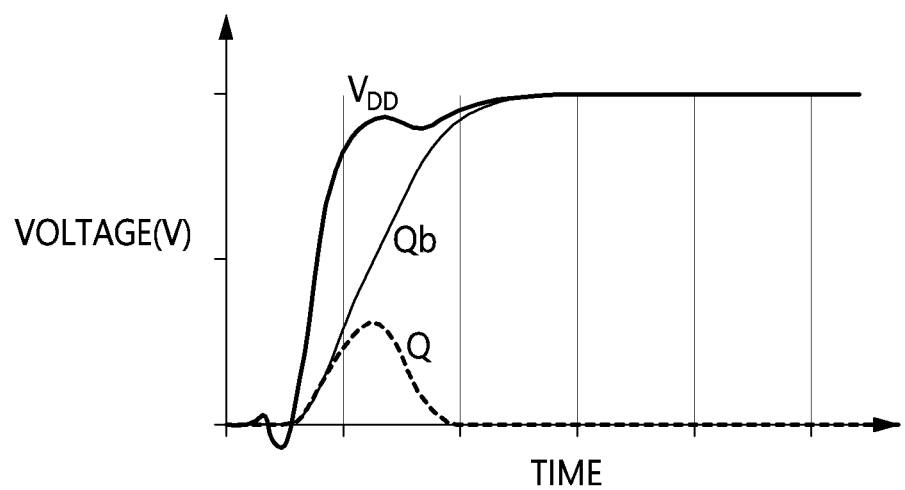

FIG. 3 is an exemplary view illustrating the initial state of a memory cell according to an embodiment, FIG. 4 is an exemplary view illustrating the transient state of a memory cell according to an embodiment, FIG. 5 and FIG. 7 are exemplary views illustrating the final state of a memory cell according to an embodiment, and FIG. 6 and FIG. 8 are graphs illustrating changes in voltages at an output terminal Q and an inverted output terminal Qb over time after a voltage is applied according to an embodiment.

Referring to FIG. 3, in the initial state, in which the voltage VDD applied to the gates of transistors is '0', which is a low level, the P-channel transistors PM1 and PM2 are turned on (the channels thereof are changed to an ON state), and the N-channel transistors NM1 and NM2 are turned off (the channels thereof are changed to an OFF state). Here, the values of the output terminal Q and the inverted output terminal Qb may be '0', which is a low level, so as to be equal to the power voltage VDD.

Referring to FIG. 4, in the transient state, in which the voltage VDD applied to the gates of the transistors starts to increase from a low level '0' to a high level '1' over time after the voltage is applied, Qb and Q, which are the respective gate voltages of the N-channel transistors NM1 and NM2, increase from '0' to '1' so as to be equal to the power voltage.

However, because the N-channel transistors NM1 and NM2 have different threshold voltages, as described above, the transistor having the lower threshold voltage may be turned on (the channel thereof is changed to an ON state) first. Accordingly, the N-channel transistor, which is turned on first, turns off the other N-channel transistor by making the gate voltage thereof '0'.

That is, as illustrated in FIG. 6, when the first N-channel transistor NM1 has a threshold voltage higher than that of the second N-channel transistor NM2, the second N-channel transistor NM2 is turned on (the channel thereof is changed to an ON state) first. Accordingly, as illustrated in FIG. 6, the voltage at the inverted output terminal Qb decreases to '0', and the voltage applied to the gate of the first N-channel transistor NM1 becomes '0', whereby the first N-channel transistor NM1 is turned off (the channel thereof is changed to an OFF state).

Conversely, as illustrated in FIG. 8, when the second N-channel transistor NM2 has a threshold voltage higher than that of the first N-channel transistor NM1, the first N-channel transistor NM1 is turned on (the channel thereof is changed to an ON state) first. Accordingly, as illustrated in FIG. 8, the voltage at the output terminal Q decreases to '0', and the voltage applied to the gate of the second N-channel transistor NM2 becomes '0', whereby the second N-channel transistor NM2 is turned off (the channel thereof is changed to an OFF state).

When the symmetrically arranged transistors have identical threshold voltages, the values of the output terminal Q and the inverted output terminal Qb cannot be predicted, but when one of the transistors is replaced with a transistor having a higher threshold voltage, as described above, the values of the output terminal Q and the inverted output terminal Qb may be arbitrarily set. Accordingly, a camouflaged logic gate that operates as one of candidate logic gates depending on the values of the output terminal Q and the inverted output terminal Qb may be implemented.

Meanwhile, an apparatus for hardware metering using a memory-type camouflaged memory cell according to the present invention may have three embodiments below.

In the first embodiment, a key that is stored in memory using a camouflaged cell at a chip design phase is simply compared with a key input at a test phase, and whether to make the memory operate normally and whether to block the supply of power may be controlled. The method using only a key is simple, and mitigates the burden of additional circuit configuration.

In the second embodiment, a key and key location information are input from the outside, and whether to make memory operate normally and whether to block the supply of power may be controlled. The method using a key and key location information may reduce the risk of exposure of key information to a fabrication plant.

In the third embodiment, whether to make the memory operate normally and whether to block the supply of power may be controlled by applying a Hash Message Authentication Code (HMAC). This method prevents a key from being directly exposed when a signal is input or output, and thus has higher security than the two aforementioned methods.

In the respective embodiments, input/output elements, information embedded in a chip at a design phase, and an element that can be exposed to a fabrication plant are those set forth in Table 1 below.

TABLE 1

| Embodiment | Input | Output | Element embedded in chip at design time | Element exposable to fab |
|---|---|---|---|---|
| 1st embodiment | key | | key key location | key location |
| 2nd embodiment | key key location | | key | |
| 3rd embodiment | key location | msg | key msg HMAC logic | msg |

Hereinafter, the three aforementioned embodiments will be described in detail with reference to FIGS. 9 to 17.

First Embodiment

Figure 9:
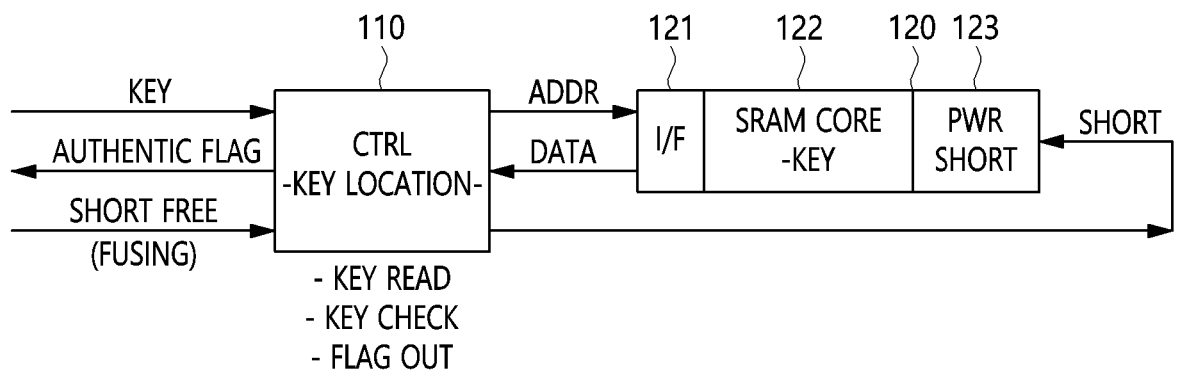
FIG. 9 is a block diagram of an apparatus for hardware metering based on a memory-type camouflaged cell according to a first embodiment of the present invention.
Figure 10:
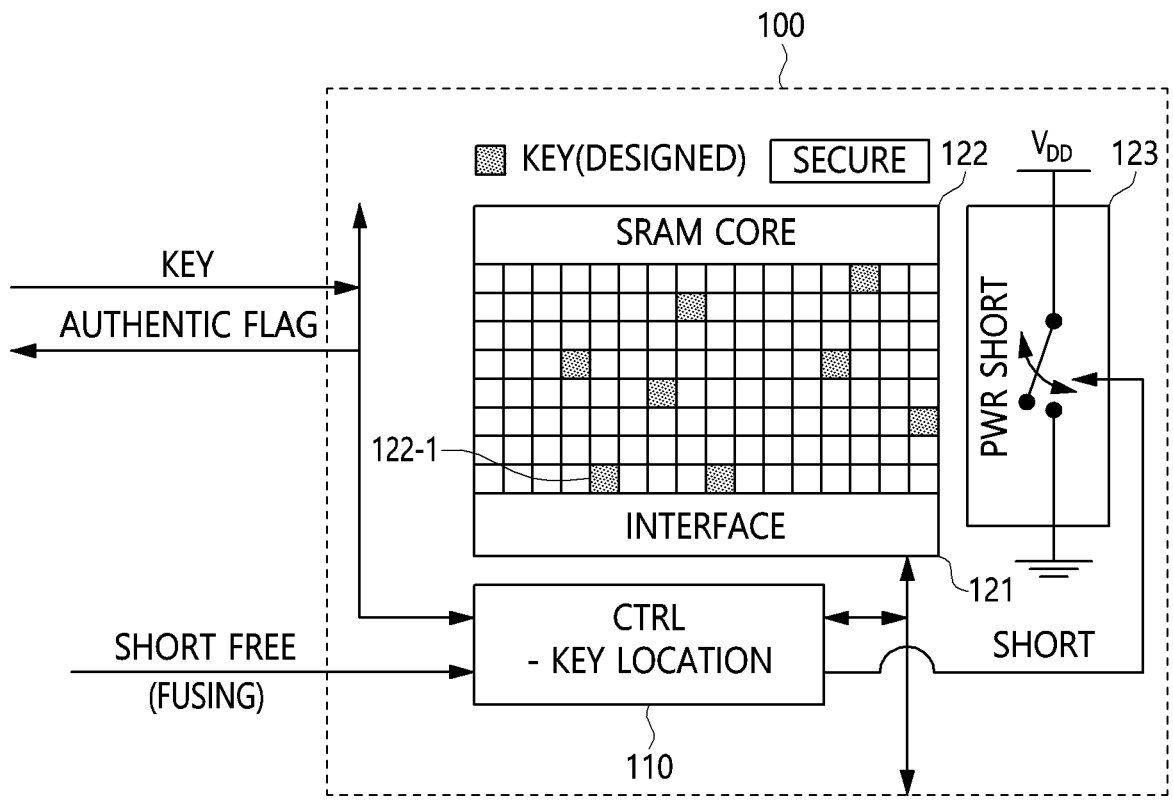
FIG. 10 is a detailed block diagram of an apparatus for hardware metering based on a memory-type camouflaged cell according to the first embodiment of the present invention.

FIG. 9 is a block diagram of an apparatus for hardware metering based on a memory-type camouflaged cell according to the first embodiment of the present invention, and FIG. 10 is a detailed block diagram of an apparatus for hardware metering based on a memory-type camouflaged cell according to the first embodiment of the present invention.

Referring to FIG. 9 and FIG. 10, the apparatus 100 for hardware metering based on a memory-type camouflaged cell according to the first embodiment of the present invention may include a controller 110 and memory 120.

Here, the memory 120 may include an interface 121, a memory core 122, and a power interrupt switch (PWR short) 123.

Here, the memory 120 may be Static Random Access Memory (SRAM) as illustrated in FIG. 9 and FIG. 10. However, this is an example, and the present invention is not limited thereto.

The interface 121 may receive a request from the controller 110, and may return information recorded in a memory cell to the controller 110 in response thereto.

The memory core 122 includes multiple memory cells, and may include at least one camouflaged memory cell 122-1 in which a designer has hidden a key value in advance at a predetermined location, among the multiple cells.

Here, the camouflaged memory cell 122-1 may be configured such that the output signal thereof is adjusted based on two or more transistors having different threshold voltages. A detailed description of the camouflaged memory cell 122-1 is the same as the above description made with reference to FIGS. 1 to 8, and thus will be omitted.

That is, an original memory cell of the memory core 122 is configured such that there is no information about the value to be output due to Process-Voltage-Temperature (PVT) variations that are caused when power is applied to NOT gates, in which input and output are connected to each other. However, the camouflaged memory cell 122-1 according to an embodiment is configured such that transistors have different threshold voltages, thereby always outputting the same value when power is applied.

Also, the camouflaged memory cell 122-1 has the same form as other memory cells of the memory, and has no problem reading and writing values, like the other memory cells.

Accordingly, even though the camouflaged memory cell 122-1 is mixed inside general memory, no one other than the designer can identify the camouflaged memory cell. Accordingly, using such a camouflaged memory cell 122-1, a key may be hidden at a location in memory that only the designer is aware of.

When such a memory-type camouflaged cell is applied, hardware metering that is more intuitive and more efficient than conventional hardware metering methods may be applied.

The power interrupt switch (PWR short) 123 is switched on or off depending on the control signal input from the controller 110, thereby enabling the chip to operate normally or preventing the chip from operating normally. That is, whether to make the chip available may be controlled depending on whether the key stored in the camouflaged memory cell 122-1 by a designer is authenticated.

The controller 110 serves to control whether to block the supply of power to the memory depending on whether or not the memory 120 is a normal chip, and stores key location information therein in advance according to the first embodiment.

Here, the key location information may be stored at a design phase.

Figure 11:
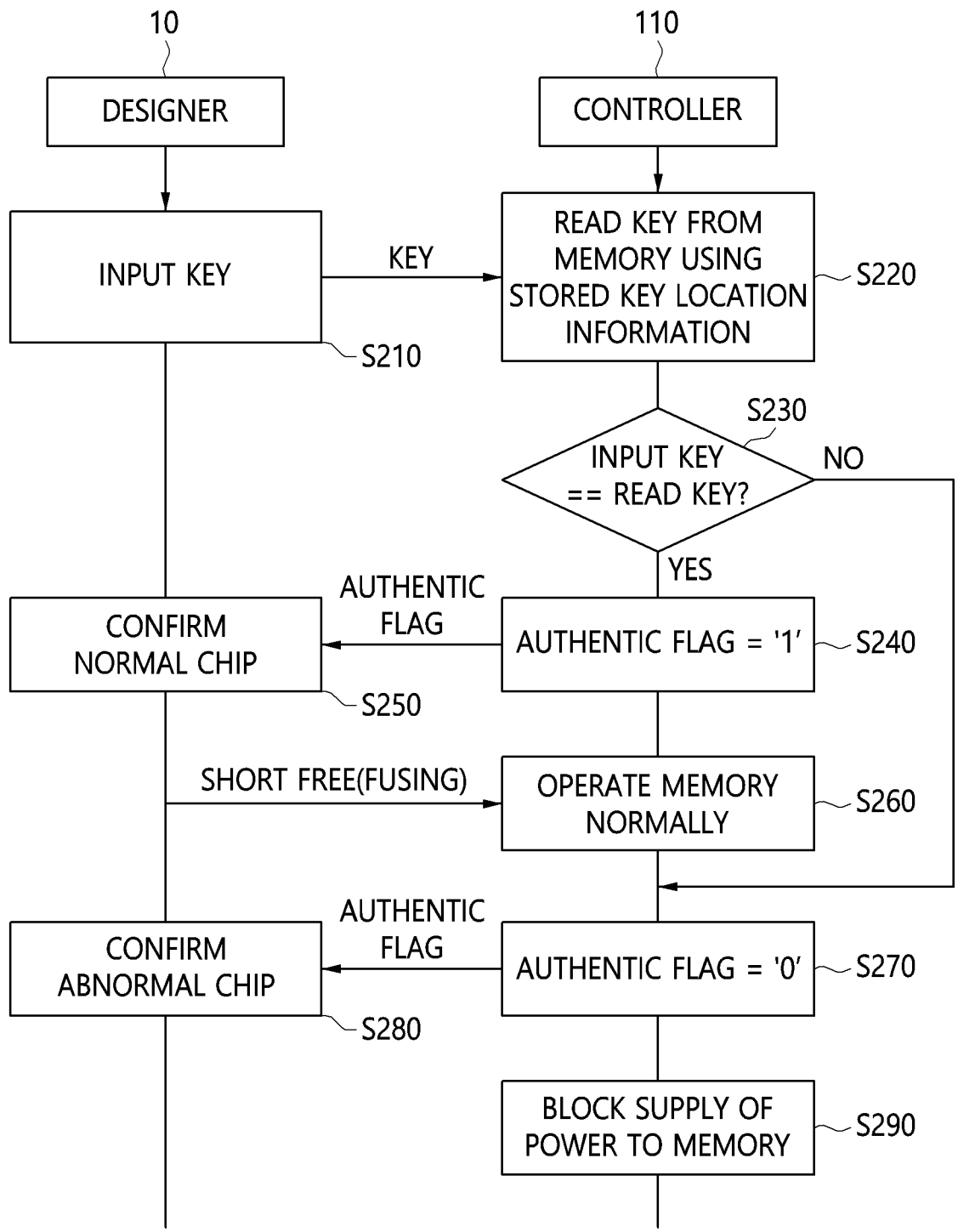
FIG. 11 is a flowchart illustrating a test procedure for hardware metering based on a memory-type camouflaged cell according to the first embodiment of the present invention.

FIG. 11 is a flowchart illustrating a test procedure for hardware metering based on a memory-type camouflaged cell according to the first embodiment of the present invention.

Referring to FIG. 11, when a key is input by a designer 10 at step S210, the controller 110 reads a key from a key location in the multiple memory cells of the memory through the interface 121 at step S220, the key location being identified based on the key location information stored in the controller 110.

Subsequently, the controller 110 compares the key input from the outside with the key read from the memory, thereby determining whether the two keys are the same as each other at step S230.

When it is determined at step S230 that the key input from the outside is the same as the key read from the memory, the controller 110 determines the memory to be a normal chip, sets an authentic flag to '1', and outputs the set authentic flag to the outside at step S240.

Accordingly, the designer 10 confirms that the memory is a normal chip based on the authentic flag at step S250, inputs a short-free signal, and terminates the test.

Accordingly, the controller 110 makes the memory operate normally at step S260 by performing a fusing operation so as to form a short-free state in response to the input from the outside. That is, the short free signal of the controller 110 prevents the power interrupt switch (PWR Short) 123 from being closed, whereby the memory operates normally.

Conversely, when it is determined at step S230 that the key input from the outside is not the same as the key read from the memory, the controller 110 sets the authentic flag to '0' and outputs the same to the outside at step S270.

Accordingly, the designer 10 confirms that the memory is an abnormal chip based on the authentic flag at step S280 and terminates the test.

Additionally, when the authentic flag is '0', the controller 110 may perform control such that the supply of power to the memory is blocked at step S290. That is, when a short-free state, which can be caused through a fusing operation, is not set, the controller 110 closes the power interrupt switch (PWR short) 123 of the memory after a certain time, thereby preventing the memory from operating normally.

Second Embodiment

Figure 12:
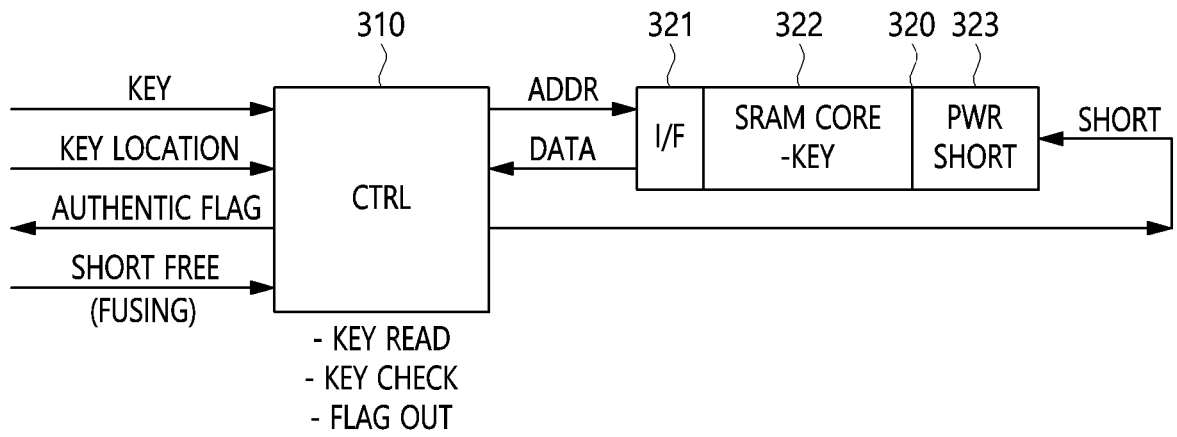
FIG. 12 is a block diagram of an apparatus for hardware metering based on a memory-type camouflaged cell according to a second embodiment of the present invention.
Figure 13:
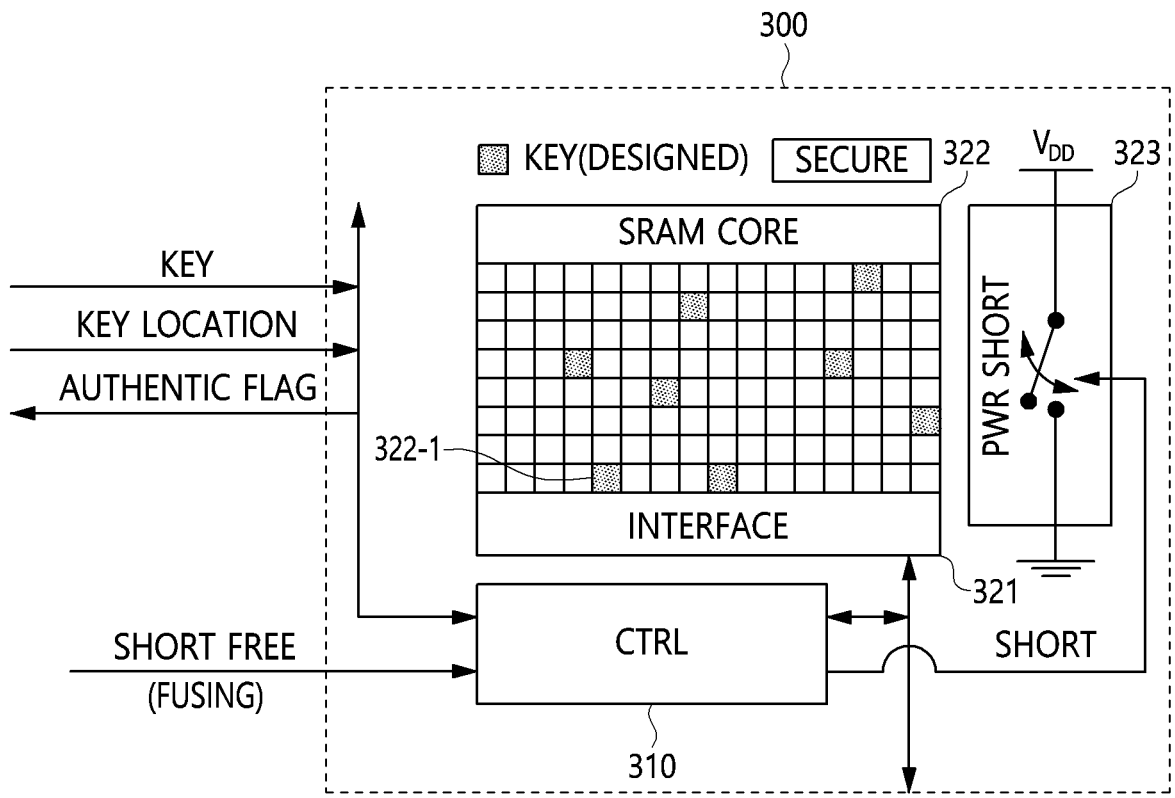
FIG. 13 is a detailed block diagram of an apparatus for hardware metering based on a memory-type camouflaged cell according to the second embodiment of the present invention.

FIG. 12 is a block diagram of an apparatus for hardware metering based on a memory-type camouflaged cell according to the second embodiment of the present invention, and FIG. 13 is a detailed block diagram of an apparatus for hardware metering based on a memory-type camouflaged cell according to the second embodiment of the present invention.

Referring to FIGS. 12 and 13, the apparatus 300 for hardware metering based on a memory-type camouflaged cell according to the second embodiment of the present invention may include a controller 310 and memory 320.

Here, the memory 320 may include an interface 321, a memory core 322, and a power interrupt switch (PWR short) 323.

Here, the memory 320 may be Static Random Access Memory (SRAM) as illustrated in FIG. 12 and FIG. 13. However, this is an example, and the present invention is not limited thereto.

The interface 321 may receive a request from the controller 310, and may return information recorded in a memory cell to the controller 310 in response thereto.

The memory core 322 includes multiple memory cells, and may include at least one camouflaged memory cell 322-1 in which a designer has hidden a key value in advance at a predetermined location, among the multiple cells.

Here, the camouflaged memory cell 322-1 may be configured such that the output signal thereof is adjusted based on two or more transistors having different threshold voltages. A detailed description of the camouflaged memory cell 322-1 is the same as the above description made with reference to FIGS. 1 to 8, and thus will be omitted.

That is, an original memory cell of the memory core 322 is configured such that there is no information about the value to be output due to Process-Voltage-Temperature (PVT) variations that are caused when power is applied to NOT gates, in which input and output are connected to each other. However, the camouflaged memory cell 322-1 according to an embodiment is configured such that transistors have different threshold voltages, thereby always outputting the same value when power is applied.

Also, the camouflaged memory cell 322-1 has the same form as other memory cells, and has no problem reading and writing values, like the other memory cells.

Accordingly, even though the camouflaged memory cell 322-1 is mixed inside general memory, no one other than the designer can identify the camouflaged memory cell. Accordingly, using such a camouflaged memory cell 322-1, a key may be hidden at a location in memory that only the designer is aware of.

When such a memory-type camouflaged cell is applied, hardware metering that is more intuitive and more efficient than conventional hardware metering methods may be applied.

The power interrupt switch (PWR short) 323 is switched on or off depending on the control signal input from the controller 310, thereby enabling the chip to operate normally or preventing the chip from operating normally. That is, whether to make the chip available may be controlled depending on whether the key stored in the camouflaged memory cell 322-1 by a designer is authenticated.

The controller 310 serves to control whether to block the supply of power to the memory depending on whether or not the memory 320 is a normal chip, and receives key location information from the outside according to the second embodiment, thereby reading a key value from the memory 320.

Figure 14:
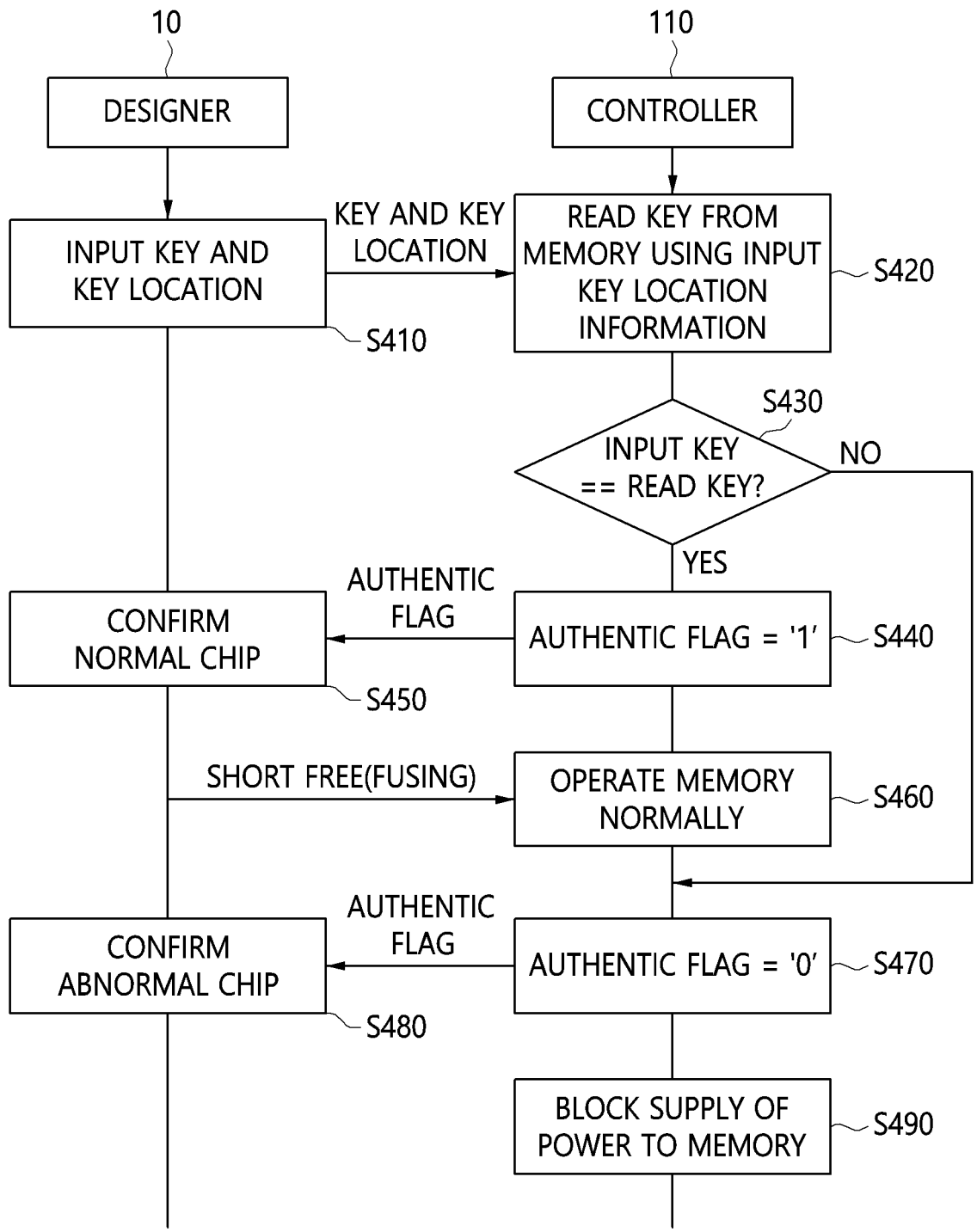
FIG. 14 is a flowchart illustrating a test procedure for hardware metering based on a memory-type camouflaged cell according to the second embodiment of the present invention.

FIG. 14 is a flowchart illustrating a test procedure for hardware metering based on a memory-type camouflaged cell according to the second embodiment of the present invention.

Referring to FIG. 14, when a key and key location information are input by a designer 10 at step S410, the controller 310 reads a key from a key location in the multiple memory cells of the memory through the interface 321 at step S420, the key location being identified based on the key location information input from the outside.

Subsequently, the controller 310 compares the key input from the outside with the key read from the memory, thereby determining whether the two keys are the same as each other at step S430.

When it is determined at step S430 that the key input from the outside is the same as the key read from the memory, the controller 310 determines the memory to be a normal chip, sets an authentic flag to '1', and outputs the set authentic flag to the outside at step S440.

Accordingly, the designer 10 confirms that the memory is a normal chip based on the authentic flag at step S450, inputs a short-free signal, and terminates the test.

Accordingly, the controller 310 makes the memory operate normally at step S460 by performing a fusing operation so as to form a short-free state in response to the input from the outside. That is, the short free signal of the controller 310 prevents the power interrupt switch (PWR Short) 323 from being closed, whereby the memory operates normally.

Conversely, when it is determined at step S430 that the key input from the outside is not the same as the key read from the memory, the controller 310 sets the authentic flag to '0' and outputs the same to the outside at step S470.

Accordingly, the designer 10 confirms that the memory is an abnormal chip based on the authentic flag at step S480 and terminates the test.

Additionally, when the authentic flag is '0', the controller 310 may perform control such that the supply of power to the memory is blocked at step S490. That is, when a short-free state, which can be caused through a fusing operation, is not set, the controller 310 closes the power interrupt switch (PWR short) 323 of the memory after a certain time, thereby preventing the memory from operating normally.

Third Embodiment

Figure 15:
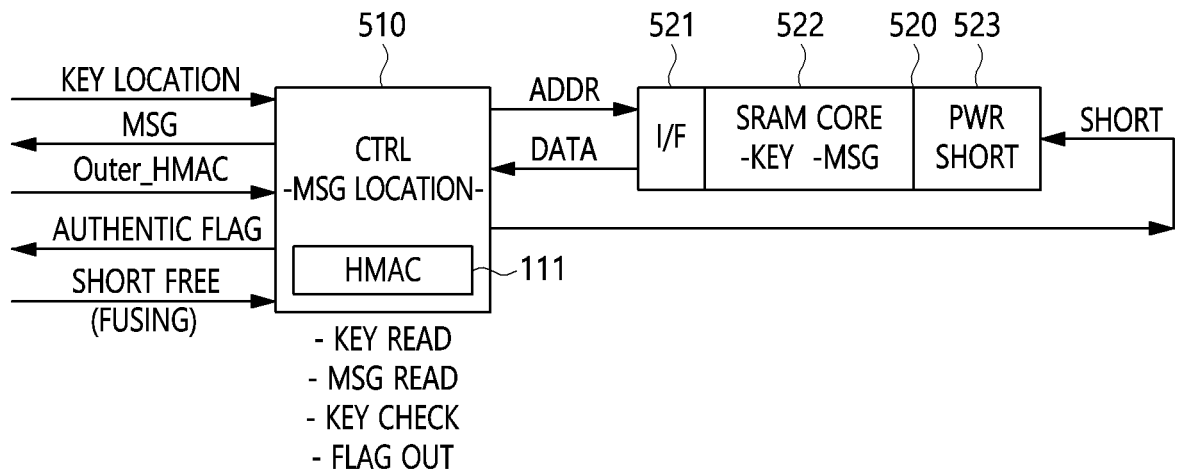
FIG. 15 is a block diagram of an apparatus for hardware metering based on a memory-type camouflaged cell according to a third embodiment of the present invention.
Figure 16:
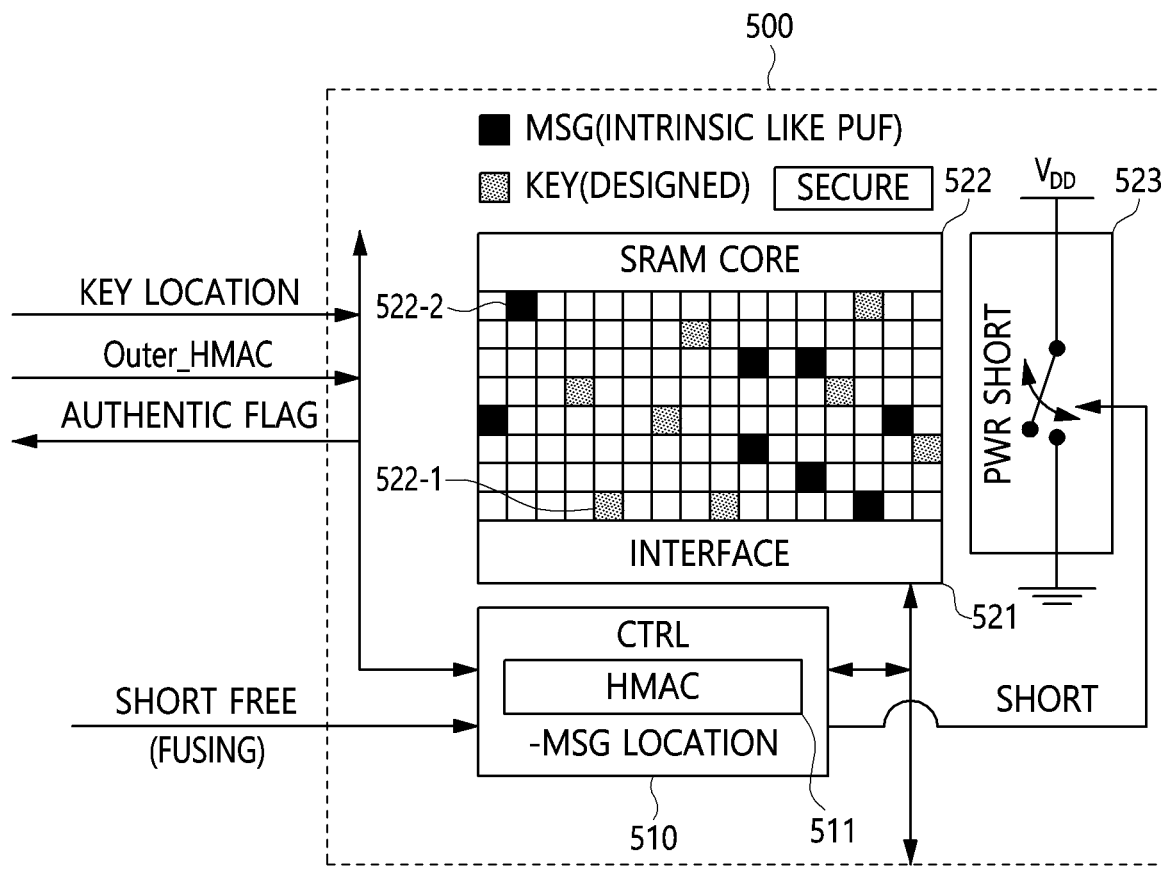
FIG. 16 is a detailed block diagram of an apparatus for hardware metering based on a memory-type camouflaged cell according to the third embodiment of the present invention.

FIG. 15 is a block diagram of an apparatus for hardware metering based on a memory-type camouflaged cell according to the third embodiment of the present invention, and FIG. 16 is a detailed block diagram of an apparatus for hardware metering based on a memory-type camouflaged cell according to the third embodiment of the present invention.

Referring to FIGS. 15 and 16, the apparatus 500 for hardware metering based on a memory-type camouflaged cell according to the third embodiment of the present invention may include a controller 510 and memory 520.

Here, the memory 520 may include an interface 521, a memory core 522, and a power interrupt switch (PWR short) 523.

Here, the memory 520 may be Static Random Access Memory (SRAM) as illustrated in FIG. 15 and FIG. 16. However, this is an example, and the present invention is not limited thereto.

The interface 521 may receive a request from the controller 510, and may return information recorded in a memory cell to the controller 510 in response thereto.

The memory core 522 includes multiple memory cells, and may include at least one camouflaged memory cell 522-1 in which a designer has hidden a key at a predetermined location, among the multiple cells.

Here, the camouflaged memory cell 522-1 may be configured such that the output signal thereof is adjusted based on two or more transistors having different threshold voltages. A detailed description of the camouflaged memory cell 522-1 is the same as the above description made with reference to FIGS. 1 to 8, and thus will be omitted.

That is, an original memory cell of the memory core 522 is configured such that there is no information about the value to be output due to Process-Voltage-Temperature (PVT) variations that are caused when power is applied to NOT gates, in which input and output are connected to each other. However, the camouflaged memory cell 522-1 according to an embodiment is configured such that transistors have different threshold voltages, thereby always outputting the same value when power is applied.

Also, the camouflaged memory cell 522-1 has the same form as other memory cells of the memory, and has no problem reading and writing values, like the other memory cells.

Accordingly, even though the camouflaged memory cell 522-1 is mixed inside general memory, no one other than the designer can identify the camouflaged memory cell. Accordingly, using such a camouflaged memory cell 522-1, a key may be hidden at a location in memory that only the designer is aware of.

When such a memory-type camouflaged cell is applied, hardware metering that is more intuitive and more efficient than conventional hardware metering methods may be applied.

Also, according to the third embodiment, the memory core 522 sets the value of a memory cell 522-2 at an arbitrary location in SRAM as a message in a design phase, and uses the message as an intrinsic value that differs even among multiple copies of the same chip, like a Physical Unclonable Function (PUF).

The power interrupt switch (PWR short) 523 is switched on or off depending on the control signal input from the controller 510, thereby enabling the chip to operate normally or preventing the chip from operating normally.

Here, according to the third embodiment, whether to make the chip available may be controlled depending on whether an HMAC based on the key stored in the camouflaged memory cell 522-1 by the designer and on the message stored in the memory cell 522-2 at a predetermined location by the designer is authenticated.

The controller 510 serves to control whether to block the supply of power to the memory depending on whether the memory 520 is a normal chip, and stores message location information (MSG location) therein in advance according to the third embodiment.

Also, the controller 510 may include a module 511 for performing a Hash Message Authentication Code (HMAC) operation based on the key stored in the camouflaged memory cell 522-1 and on the message stored in the memory cell 522-2 at the predetermined location.

Here, the message location information and the HMAC operation module 511 may be stored at the design phase.

Figure 17:
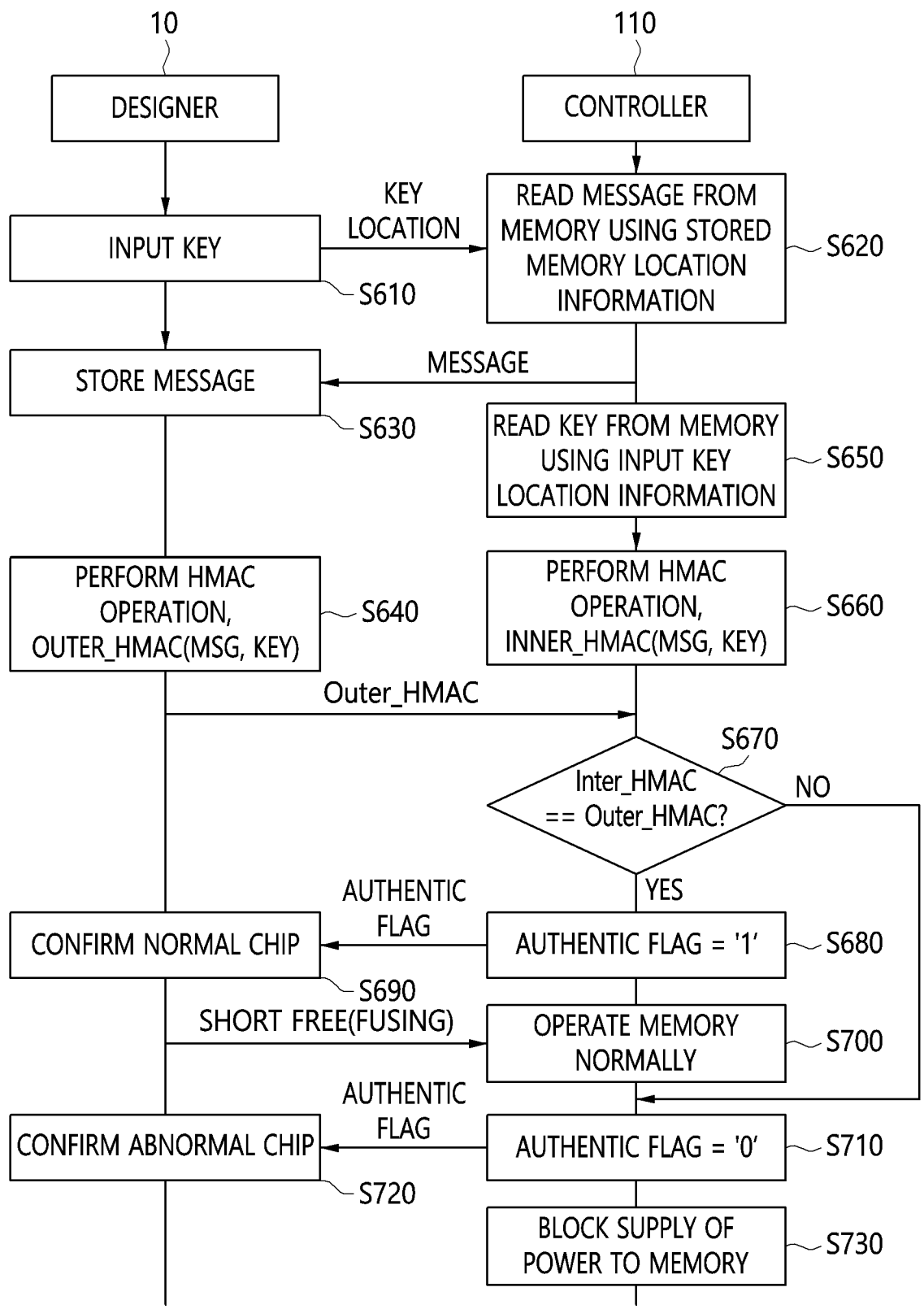
FIG. 17 is a flowchart illustrating a test procedure for hardware metering based on a memory-type camouflaged cell according to the third embodiment of the present invention.

FIG. 17 is a flowchart illustrating a test procedure for hardware metering based on a memory-type camouflaged cell according to the third embodiment of the present invention.

Referring to FIG. 17, when key location information is input by a designer 10 at step S610, the controller 510 reads a message from a message location in the multiple memory cells of the memory through the interface 521 and outputs the same at step S620, the message location being identified based on the message location information stored in the controller 510.

Accordingly, the designer 10 receives the message and stores the same at step S630, and delivers an outer HMAC, which is generated by performing a Hash Message Authentication Code (HMAC) operation using a key and the output message, to the controller 510 at step S640.

Meanwhile, the controller 510 reads a key from a key location in the multiple memory cells of the memory through the interface 521 at step S650, the key location being identified based on the key location information input from the outside.

Subsequently, the controller 510 generates an inner HMAC by performing an HMAC operation using the read message and the read key at step S660.

Subsequently, when the outer HMAC is input from the outside, the controller 510 determines whether the outer HMAC is the same as the inner HMAC at step S670.

When it is determined at step S670 that the inner HMAC is the same as the outer HMAC, the controller 510 determines the memory to be a normal chip, sets an authentic flag to '1', and outputs the set authentic flag to the outside at step S680.

Accordingly, the designer 10 confirms that the memory is a normal chip based on the authentic flag at step S690, inputs a short-free signal, and terminates the test.

Accordingly, the controller 510 makes the memory operate normally at step S700 by performing a fusing operation so as to form a short-free state in response to the input from the outside. That is, the short free signal of the controller 510 prevents the power interrupt switch (PWR Short) 523 from being closed, whereby the memory operates normally.

Conversely, when it is determined at step S670 that the inner HMAC is not the same as the outer HMAC, the controller 510 sets the authentic flag to '0' and outputs the same to the outside at step S710.

Accordingly, the designer 10 confirms that the memory is an abnormal chip based on the authentic flag at step S720 and terminates the test.

Additionally, when the authentic flag is '0', the controller 510 may perform control such that the supply of power to the memory is blocked at step S730. That is, when a short-free state, which can be caused through a fusing operation, is not set, the controller 510 closes the power interrupt switch (PWR short) 523 of the memory after a certain time, thereby preventing the memory from operating normally.

According to an embodiment, hardware metering is applied using a simple method, whereby a company specializing in semiconductor design, which has the distribution and sales rights for chips, is provided with the ability to control and count the number of chips to be manufactured.

According to an embodiment, it is easy to apply hardware metering through camouflage in a chip using SRAM.

Although embodiments of the present invention have been described with reference to the accompanying drawings, those skilled in the art will appreciate that the present invention may be practiced in other specific forms without changing the technical spirit or essential features of the present invention. Therefore, the embodiments described above are illustrative in all aspects, and should not be understood as limiting the present invention.

What is claimed is:

1. An apparatus for hardware metering using a memory-type camouflaged cell, comprising:
   memory including multiple memory cells, at least one of which is a camouflaged memory cell in which a key is hidden by a designer in advance, the at least one camouflaged memory cell being identified by the designer only; and
   a controller configured to control whether to block supply of power to the memory,
   wherein the controller is further configured to perform:
   reading the hidden key from a key location among the multiple memory cells of the memory based on key location information when a key and the key location information are input from an outside;
   determining whether the key input from the outside is identical to the key read from the memory;
   setting an authentic flag based on a determination result; and
   performing control based on the set authentic flag such that the memory operates normally or such that the supply of power is blocked and the memory is unavailable.

2. The apparatus of claim 1, wherein the camouflaged memory cell is configured such that an output signal thereof is adjusted based on two or more transistors having different threshold voltages.

3. The apparatus of claim 1, wherein setting the authentic flag is configured to set the authentic flag to '1' when the key input from the outside is identical to the key read from the hidden memory, and to set the authentic flag to '0' when the key input from the outside is not identical to the hidden key read from the memory.

4. The apparatus of claim 3, wherein:
   the controller is further configured to perform outputting the set authentic flag to the outside, and
   performing the control is configured to perform the control such that the memory operates normally through fusing of the memory in response to a request from the outside when the authentic flag is '1'.

5. The apparatus of claim 3, wherein:
   performing the control is configured to perform the control such that the supply of power to the memory is blocked when the authentic flag is '0'.

6. An apparatus for hardware metering using a memory-type camouflaged cell, comprising:
   memory including multiple memory cells, at least one of which is a camouflaged memory cell in which a key is hidden by a designer in advance, the at least one camouflaged memory cell being identified by the designer only and a memory cell in which a message is stored; and
   a controller configured to control whether to block supply of power to the memory,
   wherein the controller is further configured to perform:
   reading the message from the memory based on a message location stored in the controller in advance and outputting the message when a key location is input from an outside;
   performing a Hash Message Authentication Code (HMAC) operation based on the message and on the key that is read from the memory based on the key location input from the outside;

in response to an outer HMAC input from the outside, determining whether the outer HMAC is identical to an inner HMAC;

setting an authentic flag based on a determination result; and performing control based on the set authentic flag such that the memory operates normally or such that the supply of power is blocked and the memory is unavailable.

7. The apparatus of claim 6, wherein the camouflaged memory cell is configured such that an output signal thereof is adjusted based on two or more transistors having different threshold voltages.

8. The apparatus of claim 6, wherein the outer HMAC is acquired by performing the HAMC operation using a key and the message that is output to the outside.

9. The apparatus of claim 6, wherein setting the authentic flag is configured to set the authentic flag to '1' when the outer HMAC is identical to the inner HMAC, and to set the authentic flag to '0' when the outer HMAC is not identical to the inner HMAC.

10. The apparatus of claim 9, wherein:

the controller is further configured to perform outputting the set authentic flag to the outside, and performing the control is configured to perform the control such that the memory operates normally through fusing of the memory in response to a request from the outside when the authentic flag is '1'.

11. The apparatus of claim 9, wherein:

performing the control is configured to perform the control such that the supply of power to the memory is blocked when the authentic flag is '0'.

\* \* \* \* \*